(12) United States Patent
Dai et al.

(10) Patent No.: US 10,955,954 B2
(45) Date of Patent: Mar. 23, 2021

(54) FLEXIBLE SUBSTRATE AND FLEXIBLE DISPLAY PANEL, FLEXIBLE DISPLAY DEVICE THEREOF AND METHOD OF USING FLEXIBLE DISPLAY DEVICE

(71) Applicants: BOE TECHNOLOGY GROUP CO., LTD., Beijing (CN); CHENGDU BOE OPTOELECTRONICS TECHNOLOGY CO., LTD., Chengdu (CN)

(72) Inventors: Weinan Dai, Beijing (CN); Yuanzheng Guo, Beijing (CN)

(73) Assignees: BOE TECHNOLOGY GROUP CO., LTD., Beijing (CN); CHENGDU BOE OPTOELECTRONICS TECHNOLOGY CO., LTD., Sichuan (CN)

( * ) Notice: Subject to any disclaimer, the term of this patent is extended or adjusted under 35 U.S.C. 154(b) by 0 days.

(21) Appl. No.: 16/217,587

(22) Filed: Dec. 12, 2018

(65) Prior Publication Data
US 2019/0324586 A1 Oct. 24, 2019

(30) Foreign Application Priority Data
Apr. 24, 2018 (CN) .......................... 201810374749.0

(51) Int. Cl.
*B32B 5/18* (2006.01)
*G06F 3/041* (2006.01)
(Continued)

(52) U.S. Cl.
CPC .............. *G06F 3/0414* (2013.01); *B32B 5/18* (2013.01); *B32B 27/281* (2013.01); *H01L 27/323* (2013.01); *H01L 51/0097* (2013.01)

(58) Field of Classification Search
CPC ................. G06F 3/0414; G06F 3/0443; G06F 2203/04105; G06F 3/0447; G06F 3/0445;
(Continued)

(56) References Cited

U.S. PATENT DOCUMENTS

| 2015/0009173 A1* | 1/2015 | Rodzevski | G06F 3/0414 |
| | | | 345/174 |
| 2017/0205940 A1* | 7/2017 | Guanter | G04G 21/08 |

(Continued)

FOREIGN PATENT DOCUMENTS

| CN | 101308422 A | 11/2008 |
| CN | 102365608 A | 2/2012 |

(Continued)

OTHER PUBLICATIONS

China First Office Action, Application No. 201810374749.0, dated Mar. 26, 2020, 23 pps.: with English translation.
(Continued)

*Primary Examiner* — Amit Chatly
(74) *Attorney, Agent, or Firm* — Armstrong Teasdale LLP

(57) ABSTRACT

The present disclosure relates to a flexible substrate and a flexible display panel, a flexible display device thereof, and a method of using the flexible display device. The flexible substrate includes a first flexible layer and a second flexible layer, and a pressure sensitive layer and an electrode between the first flexible layer and the second flexible layer, the pressure sensitive layer having a first side facing the first flexible layer and a second surface facing the second flexible layer, wherein the electrode is located on at least one of the first side and the second side. The pressure sensitive layer includes an elastic layer. The elastic layer includes a polyimide foam material.

5 Claims, 4 Drawing Sheets

(51) Int. Cl.
  *B32B 27/28*    (2006.01)
  *H01L 27/32*    (2006.01)
  *H01L 51/00*    (2006.01)

(58) Field of Classification Search
  CPC ....... G06F 2203/04102; H01L 51/0097; H01L 27/323; B32B 27/281; B32B 5/18
  See application file for complete search history.

(56) References Cited

U.S. PATENT DOCUMENTS

| | | |
|---|---|---|
| 2018/0059822 A1* | 3/2018 | Seo ........................ G06F 1/1643 |
| 2018/0175117 A1* | 6/2018 | Lee ........................ H01L 27/323 |
| 2018/0217639 A1* | 8/2018 | Jones ................... H05K 1/0306 |
| 2018/0253169 A1* | 9/2018 | Carley ................... G06F 3/0447 |
| 2019/0041912 A1* | 2/2019 | Ha ........................ G06F 3/0485 |

FOREIGN PATENT DOCUMENTS

| | | |
|---|---|---|
| CN | 105653094 A | 6/2016 |
| CN | 106095210 A | 11/2016 |
| CN | 106547386 A | 3/2017 |
| CN | 107102770 A | 8/2017 |
| CN | 107407972 A | 11/2017 |
| CN | 107667335 A | 2/2018 |
| JP | 2013045398 A | 3/2013 |
| WO | 2012035021 A1 | 3/2012 |

OTHER PUBLICATIONS

China Rejection Decision, Application No. 201810374749.0, dated Jan. 7, 2021, 9 pps. with English translation.

\* cited by examiner

FLEXIBLE SUBSTRATE AND FLEXIBLE DISPLAY PANEL, FLEXIBLE DISPLAY DEVICE THEREOF AND METHOD OF USING FLEXIBLE DISPLAY DEVICE

CROSS REFERENCE TO RELATED APPLICATIONS

This patent application claims the benefit and priority of Chinese Patent Application No. 201810374749.0 filed on Apr. 24, 2018, the disclosure of which is incorporated by reference herein in its entirety as part of the present application.

BACKGROUND

Embodiments of the present disclosure relate to a field of display technologies, and in particular, to a flexible substrate and a flexible display panel, a flexible display device thereof, and a method of using the flexible display device.

At present, when manufacturing a flexible display device, it is necessary to use a flexible material such as polyimide (PI) as a substrate. First, the PI material is coated on a glass substrate, then, a circuit and a luminescent material are fabricated on the PI material and the film packaging is completed, and finally, the back of the resulting structure is scanned by a laser, so as to separate the PI from the glass substrate, thereby a flexible display device is obtained.

BRIEF DESCRIPTION

Embodiments of the present disclosure provide a flexible substrate and a flexible display panel, a flexible display device thereof, and a method of using the flexible display device.

A first aspect of the present disclosure provides a flexible substrate. The flexible substrate includes a first flexible layer and a second flexible layer, and a pressure sensitive layer and an electrode between the first flexible layer and the second flexible layer. The pressure sensitive layer has a first side facing the first flexible layer and a second surface facing the second flexible layer. The electrode is located on at least one of the first side and the second side.

In an embodiment of the present disclosure, the pressure sensitive layer includes an elastic layer.

In an embodiment of the present disclosure, the elastic layer includes a polyimide foam material.

In an embodiment of the present disclosure, a material of the first flexible layer and a material of the second flexible layer are polyimide.

In an embodiment of the present disclosure, the electrode includes a plurality of sub-electrodes spaced apart in a direction parallel to the pressure sensitive layer.

In an embodiment of the present disclosure, the plurality of sub-electrodes include a first sub-electrode on the first side or a second sub-electrode on the second side.

In an embodiment of the present disclosure, the plurality of sub-electrodes include a first sub-electrode on the first side and a second sub-electrode on the second side, wherein an orthographic projection of the first sub-electrode on the pressure sensitive layer at least partially overlaps with an orthographic projection of the second sub-electrode on the pressure sensitive layer.

In an embodiment of the present disclosure, the flexible substrate includes a central region and an edge region surrounding the central region, and a size of the sub-electrode in the edge region is smaller than a size of the sub-electrode in the central region.

A second aspect of the present disclosure provides a flexible display panel. The flexible display panel includes the flexible substrate described in the first aspect of the present disclosure and an organic light emitting device on the flexible substrate.

A third aspect of the present disclosure provides a flexible display device. The flexible display device includes a frame and the flexible display panel described in the second aspect of the present disclosure supported on the frame.

In an embodiment of the present disclosure, the frame has a recess or a hollow region at a position corresponding to the sub-electrode.

In an embodiment of the present disclosure, the electrode includes a plurality of sub-electrodes spaced apart in a direction parallel to the pressure sensitive layer. The plurality of sub-electrodes includes a first sub-electrode on the first side and a second sub-electrode on the second side. The first sub-electrode, the second sub-electrode and the pressure sensitive layer constitute a pressure detecting device.

In an embodiment of the present disclosure, the frame has a recess at a position corresponding to the sub-electrode. The electrode includes a plurality of sub-electrodes spaced apart in a direction parallel to the pressure sensitive layer. The plurality of sub-electrodes are located on a side of the pressure sensitive layer facing away from the frame. At least a surface of the recess of the frame includes a conductive material. The sub-electrode, the pressure sensitive layer, and the conductive material constitute a pressure detecting device.

In an embodiment of the present disclosure, the flexible substrate includes a central region and an edge region surrounding the central region. The frame is configured such that the edge region of the flexible substrate is curved.

In an embodiment of the present disclosure, the frame is configured such that the edge region is perpendicular to the central region.

A fourth aspect of the present disclosure provides a method of using the flexible display device described in the third aspect of the present disclosure in an underwater environment. The flexible display device includes a touching device and a pressure detecting device at least including the pressure sensitive layer and the electrode. The method includes enabling a touching function of the touching device and a pressure detecting function of the pressure detecting device, and adjusting a user interface of the flexible display device to a first mode, detecting a capacitance of the touching device across a touching region of the flexible display panel, determining whether the capacitance being globally changed or locally changed across the flexible display panel, in response to the capacitance being locally changed, maintaining the touching function and the pressure detecting function, in response to the capacitance being globally changed, disabling the touching function while maintaining the pressure detecting function and adjusting the user interface of the flexible display device to a second mode different from the first mode.

In an embodiment of the present disclosure, the first mode is a 3D touching mode and the second mode is an underwater touching mode.

BRIEF DESCRIPTION OF THE DRAWINGS

The drawings described herein are for illustrative purposes only of selected embodiments and not all possible implementations, and are not intended to limit the scope of the present disclosure.

Corresponding reference numerals indicate corresponding parts or features throughout the several views of the drawings.

DETAILED DESCRIPTION

As used herein and in the appended claims, the singular form of a word includes the plural, and vice versa, unless the context clearly dictates otherwise. Thus, the references "a", "an", and "the" are generally inclusive of the plurals of the respective terms. Similarly, the words "include", "includes", and "comprising" are to be interpreted inclusively rather than exclusively. Likewise, the terms "include", "including" and "or" should all be construed to be inclusive, unless such a construction is clearly prohibited from the context. Where used herein the term "examples," particularly when followed by a listing of terms is merely exemplary and illustrative, and should not be deemed to be exclusive or comprehensive.

Further to be noted, when the elements and the embodiments thereof of the present application are introduced, the articles "a/an", "one", "the" and "said" are intended to represent the existence of one or more elements. Unless otherwise specified, "a plurality of" means two or more. The expressions "include", "include", "contain" and "have" are intended as inclusive and mean that there may be other elements besides those listed. The terms such as "first" and "second" are used herein only for purposes of description and are not intended to indicate or imply relative importance and the order of formation.

The flow diagrams depicted herein are just one example. There may be many variations to this diagram or the steps described therein without departing from the spirit of the disclosure. For instance, the steps may be performed in a differing order or steps may be added, deleted, or modified. All of these variations are considered a part of the claimed disclosure.

Example embodiments will now be described more fully with reference to the accompanying drawings.

At present, for a flexible display device having a pressure detecting function, an externally purchased pressure elastic layer is still used as a pressure detecting function layer, which results in that the cost of procurement is high while the additional pressure detecting function layer causes a larger thickness.

Figure 1:
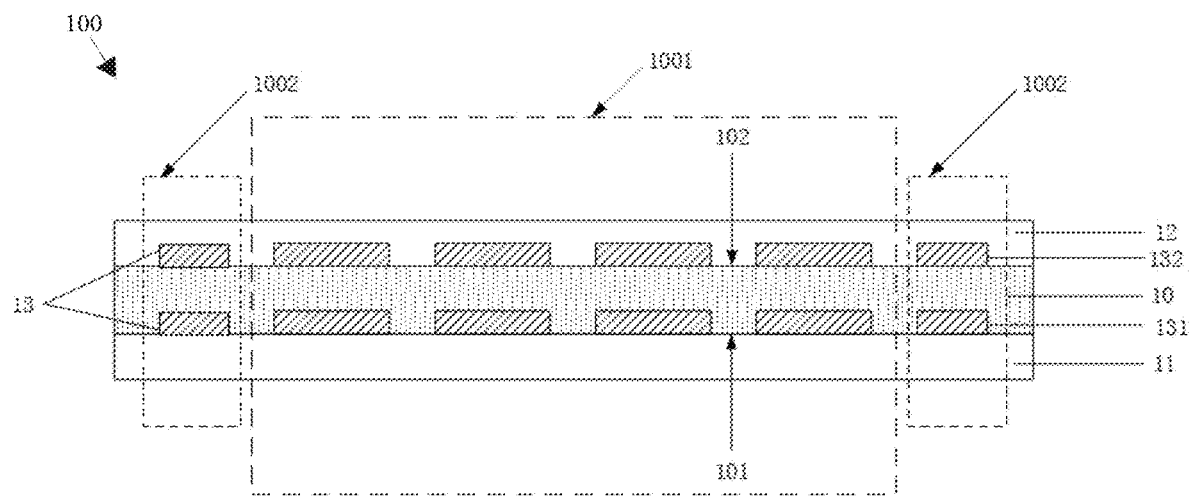
FIG. 1 illustrates a cross-sectional schematic view of a flexible substrate in accordance with an embodiment of the present disclosure.

In an embodiment of the present disclosure, a flexible substrate is provided. FIG. 1 shows a cross-sectional schematic view of a flexible substrate in accordance with an embodiment of the present disclosure. As shown in FIG. 1, the flexible substrate 100 includes a first flexible layer 11 and a second flexible layer 12, and a pressure sensitive layer 10 and an electrode 13 located between the first flexible layer 11 and the second flexible layer 12.

In an exemplary embodiment of the present disclosure, the pressure sensitive layer 10 may include an elastic layer.

In an exemplary embodiment of the present disclosure, the elastic layer may include a polyimide foam material. As an example, the polyimide foam material can be prepared by high-temperature heating a raw material including a polyanhydride and a polyisocyanate under the action of a surfactant and a catalyst. It is to be noted that, the polyimide foam material used in the present disclosure may also be prepared according to other existing raw materials and techniques, and only one specific embodiment is given above, which can't be considered as a limit to the disclosure. Further, when preparing the polyimide foam material, the elasticity of the material can be controlled by controlling the size and density of the foam in the material, thereby the sensitivity of the pressure detecting can be controlled.

In an exemplary embodiment of the present disclosure, a material of the first flexible layer 11 and a material of the second flexible layer 12 may include polyimide. Here, since the material of the pressure sensitive layer is made of a polyimide foam material, the manufacturing process can be simplified.

It should be noted that, in an embodiment of the present disclosure, since the flatness of the flexible substrate 100 directly affects the uniformity of the focal plane during the exposure process, and the flat surface of the flexible substrate 100 is beneficial to the fabrication of subsequent device, the pressure sensitive layer 10 is disposed between the first and second flexible layers 11, 12. Specifically, the first flexible layer or the second flexible layer has a fluidity before being cured, so that the first flexible layer 11 or the second flexible layer 12 can be utilized to planarize the surface of the pressure sensitive layer 10.

In an embodiment of the present disclosure, the pressure sensitive layer 10 has a first side 101 facing the first flexible layer 11 and a second side 102 facing the second flexible layer 12. It should be noted that, the first side and the second side herein may refer to the inner surface of the pressure sensitive layer 10, and may also refer to the outer surface of the pressure sensitive layer 10. The electrode 13 is located on at least one of the first side 101 and the second side 102.

It should be noted that, the pressure detecting can be implemented by the following method. The pressure sensitive layer 10 is compressed to change the distance between the electrodes 13 on both sides of the pressure sensitive layer 10, thereby changing the capacitance. The amount of change of the capacitance and the position being touched can be combined to realize 3D touching function. The electrode 13 herein may be a double layer electrode or a single layer electrode.

In an embodiment of the present disclosure, the electrode 13 includes a plurality of sub-electrodes 13 spaced apart in a direction parallel to the pressure sensitive layer 10. Thereby, the sensitivity of the pressure detecting can be improved.

As an example, in the case where a single layer electrode is applied, the plurality of sub-electrodes 13 may include a first sub-electrode 131 on the first side 101 or a second sub-electrode 132 on the second side 102. As another example, in the case where a double layer electrode is applied, the plurality of sub-electrodes 13 may include the first sub-electrode 131 on the first side 101 and the second sub-electrode 132 on the second side 102. The case about the single layer electrode will be described in detail later. Here, the case about the double layer electrode will be described in detail first.

In the case where the plurality of sub-electrodes 13 include the first sub-electrode 131 and the second sub-electrode 132, an orthographic projection of the first sub-electrode 131 on the pressure sensitive layer 10 at least partially overlaps with an orthographic projection of the second sub-electrode 132 on the pressure sensitive layer 10. FIG. 1 shows a case where the above-described orthographic projection of the first sub-electrode 131 completely overlaps with the above-described orthographic projection of the second sub-electrode 132. It should be understood that the situation illustrated in FIG. 1 is an embodiment of the embodiments of the present disclosure and should not be considered as a limit to the disclosure. Other embodiments may be selected as needed by those skilled in the art which will not be described herein.

In an exemplary embodiment of the present disclosure, as an example, the first and second sub-electrodes 131, 132 may be formed by forming an electrode block by screen printing using a liquid conductive material of a metal-silver paste type. As another example, the first and second sub-electrodes 131, 132 may also be formed by sputtering, photolithography, or etching.

According to the above embodiment, the integration of the pressure sensitive layer into the flexible substrate eliminates the need in the prior art for the external purchase of the pressure sensitive layer and the post-bonding process, thereby greatly saving costs. Further, in an embodiment of the present disclosure, the thickness of the flexible substrate including the pressure sensitive layer is thinner than the structure including the externally bonded pressure sensitive layer in the prior art. Further, since the preparation of the pressure sensitive layer can be completed while preparing the flexible substrate, the elastic parameters of the pressure sensitive layer can be adjusted by adjusting the preparation process of the flexible substrate, so that the resulting flexible substrate has more applicability. As an example, in particular, in the case where the material of the pressure sensitive layer is a polyimide foam material, the elastic parameters of the pressure sensitive layer can be adjusted by controlling the size and density of the generated bubbles during the curing of the polyimide foam material.

In an embodiment of the present disclosure, the flexible substrate 100 includes a central region 1001 and an edge region 1002 surrounding the central region 1001. The size of the sub-electrode 13 in the edge region 1002 is smaller than the size of the sub-electrode 13 in the central region 1001. In an exemplary embodiment of the present disclosure, the flexible substrate 100 may be used for a display device having a side displaying. In this case, the flexible substrate 100 includes a region for planner displaying and a region for side displaying. Accordingly, the edge region 1002 of the flexible substrate 100 corresponds to the region for side displaying, and the central region 1001 of the flexible substrate 100 corresponds to the region for planner displaying. Since the area of the region for side displaying is generally smaller than the area for planner displaying, the size of the sub-electrode 13 in the region for side displaying is smaller than the size of the sub-electrode 13 in the region for planner displaying. That is, the size of the sub-electrode 13 in the edge region 1002 is smaller than the size of the sub-electrode 13 in the central region 1001.

Figure 2:
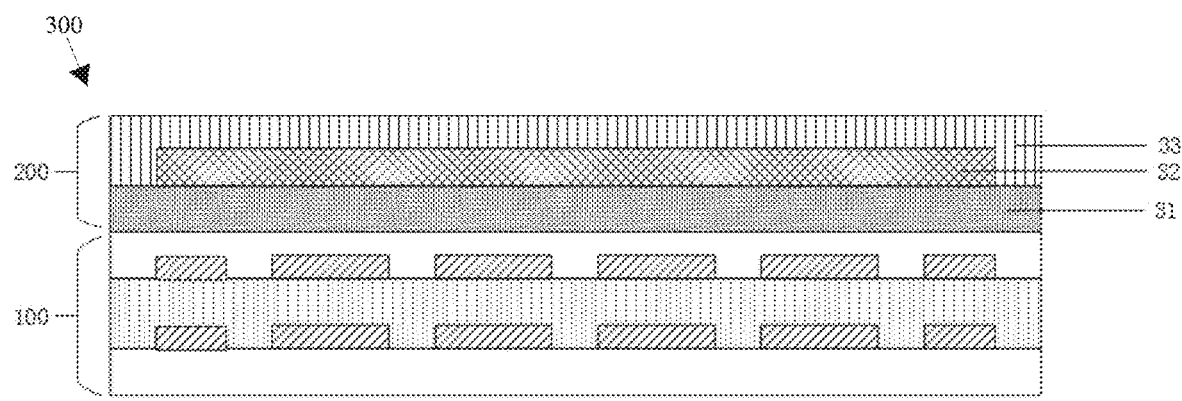
FIG. 2 illustrates a cross-sectional schematic view of a flexible display panel in accordance with an embodiment of the present disclosure.

In an embodiment of the present disclosure, a flexible display panel is also provided. FIG. 2 illustrates a cross-sectional schematic view of a flexible display panel in accordance with an embodiment of the present disclosure. As shown in FIG. 2, the flexible display panel 300 includes the flexible substrate 100 as described above and the organic light emitting device 200 on the flexible substrate. The organic light emitting device 200 includes a pixel circuit 31 on the flexible substrate 100, a light emitting layer 32 on the pixel circuit 31, and a thin film encapsulation layer 33 covering the pixel circuit 31 and the light emitting layer 32.

In an embodiment of the present disclosure, a flexible display device is also provided. The flexible display device includes a frame and the flexible display panel as described above supported on the frame.

Figure 3:
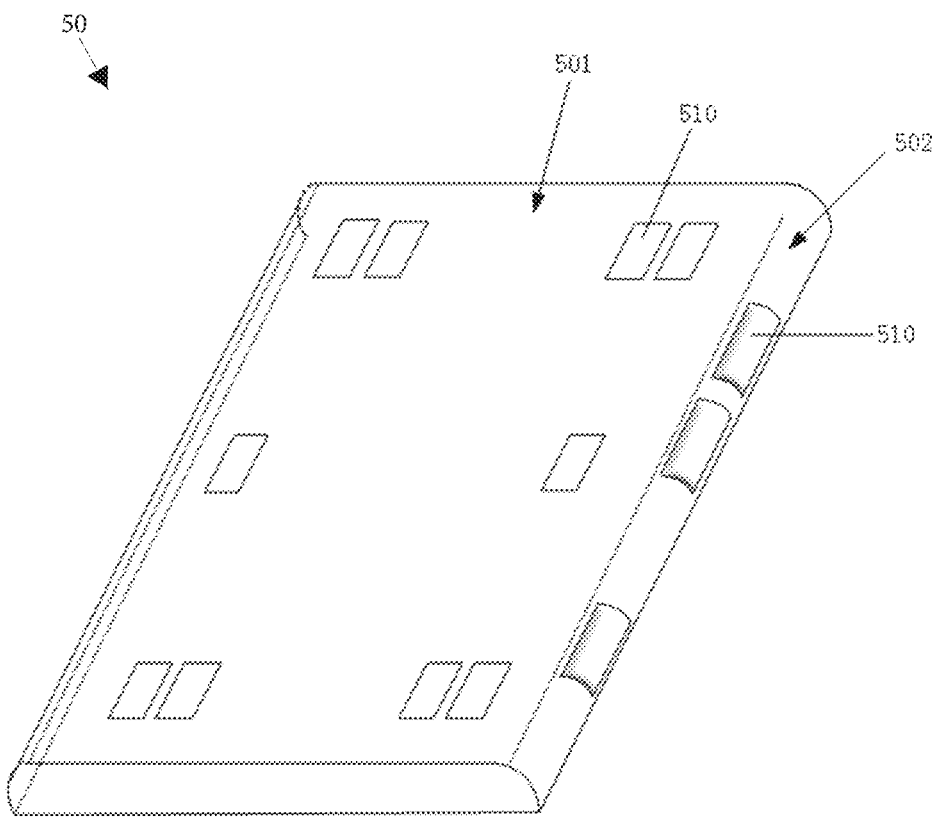
FIG. 3 illustrates a structural schematic view of a frame in accordance with an embodiment of the present disclosure.

FIG. 3 shows a structural schematic view of a frame in accordance with an embodiment of the present disclosure. As shown in FIG. 3, the frame 50 has a recess or a hollow region 510 at a position corresponding to the electrode 13 (i.e., the sub-electrode 13) in the flexible display panel 300, so that a local deformation amount can be increased when the pressure detecting is performed, thereby improving the pressure detecting sensitivity.

In an embodiment of the present disclosure, the flexible substrate 100 includes the central region 1001 and the edge region 1002 surrounding the central region 1001. Further, the frame 50 is configured such that the edge region 1002 of the flexible substrate 100 is curved. Still further, the frame 50 is configured such that the edge region 1002 is perpendicular to the central region 1001. Thus, the flexible display device according to an embodiment of the present disclosure can be applied to a flexible display device having a side displaying function. Further, correspondingly, the frame 50 may include a region 501 for planner displaying corresponding to the central region 1001 of the flexible substrate 100 and a region 502 for side displaying corresponding to the edge region 1002 of the flexible substrate 100. As an example, a recess or a hollow region 510 may be provided in both the region 501 for planner displaying and the region 502 for side displaying of the frame 50. As another example, the recess or the hollow region 510 may be provided only in the region 502 for side displaying of the frame 50.

It should be noted that the recess or the hollow region 510 is only schematically illustrated in FIG. 3, and in fact, the recess or the hollow region 510 may be provided over the entire region 501 for planner displaying and the entire region 502 for side displaying.

In an exemplary embodiment of the present disclosure, the frame 50 may be a conductor frame or a non-conductor frame.

In an exemplary embodiment of the present disclosure, in the case where a double layer electrode is applied, that is, as shown in FIG. 1, in the case where the flexible substrate 100 includes the first sub-electrode 131 on the first side 101 and the second sub-electrode 132 on the second side 102, the first sub-electrode 131, the second sub-electrode 132, and the pressure sensitive layer 10 constitute a pressure detecting device.

In an exemplary embodiment of the present disclosure, when a single layer electrode is applied, the frame 50 has a recess 510 at a position corresponding to the sub-electrode 13 in the flexible display panel 300.

Figure 4:
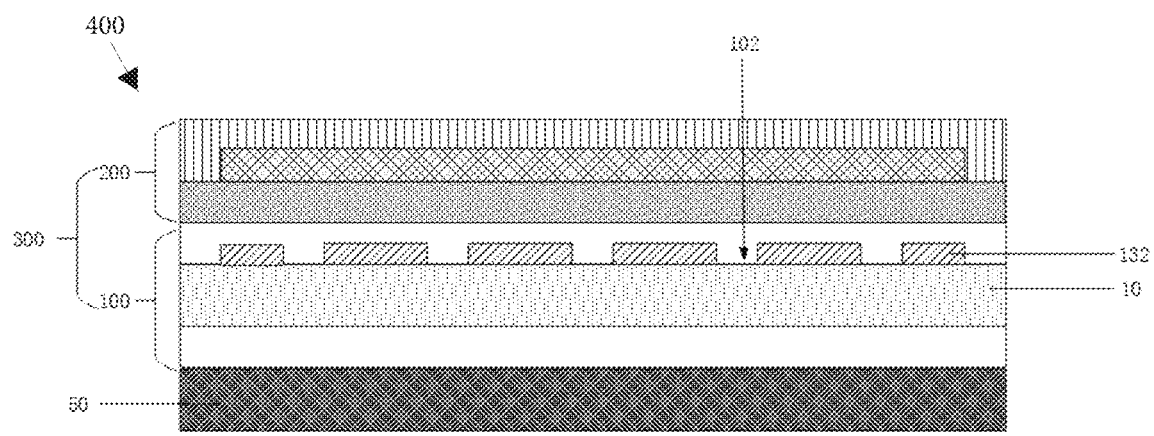
FIG. 4 illustrates a cross-sectional schematic view of a flexible display device in accordance with an embodiment of the present disclosure.

In the case where a single layer electrode is applied, as shown in FIG. 4, in the flexible display device 400, the flexible substrate 100 includes a sub-electrode on a side of the pressure sensitive layer 10 facing away from the frame 50, for example, the second sub-electrode 132 on the second side 102. At least the surface of the recess 510 (not shown in FIG. 4) of the frame 50 includes a conductive material (not shown in FIG. 4) that can serve as an electrode of the pressure detecting device.

As an example, on the one hand, in the case where the frame 50 is a non-conductor frame, a conductive material may be disposed on the entire surface of the frame 50 or only the surface of the recess 510 of the frame 50. At this time, the second sub-electrode 132, the pressure sensitive layer 10 and the conductive material of the frame 50 constitute a pressure detecting device.

As another example, on the other hand, in the case where the frame 50 is a conductor frame, since the frame itself is composed of a conductive material, the frame 50 may directly function as an electrode. Similar to FIG. 4, the second sub-electrode 132, the pressure sensitive layer 10 and the frame 50 constitute a pressure detecting device.

In an embodiment of the present disclosure, there is also provided a method of using the flexible display device as described above in an underwater environment. It should be noted that the flexible display device includes a touching device and a pressure detecting device. Here, the pressure detecting device includes at least the pressure sensitive layer 10 and the electrode 13 as described above.

Figure 5:
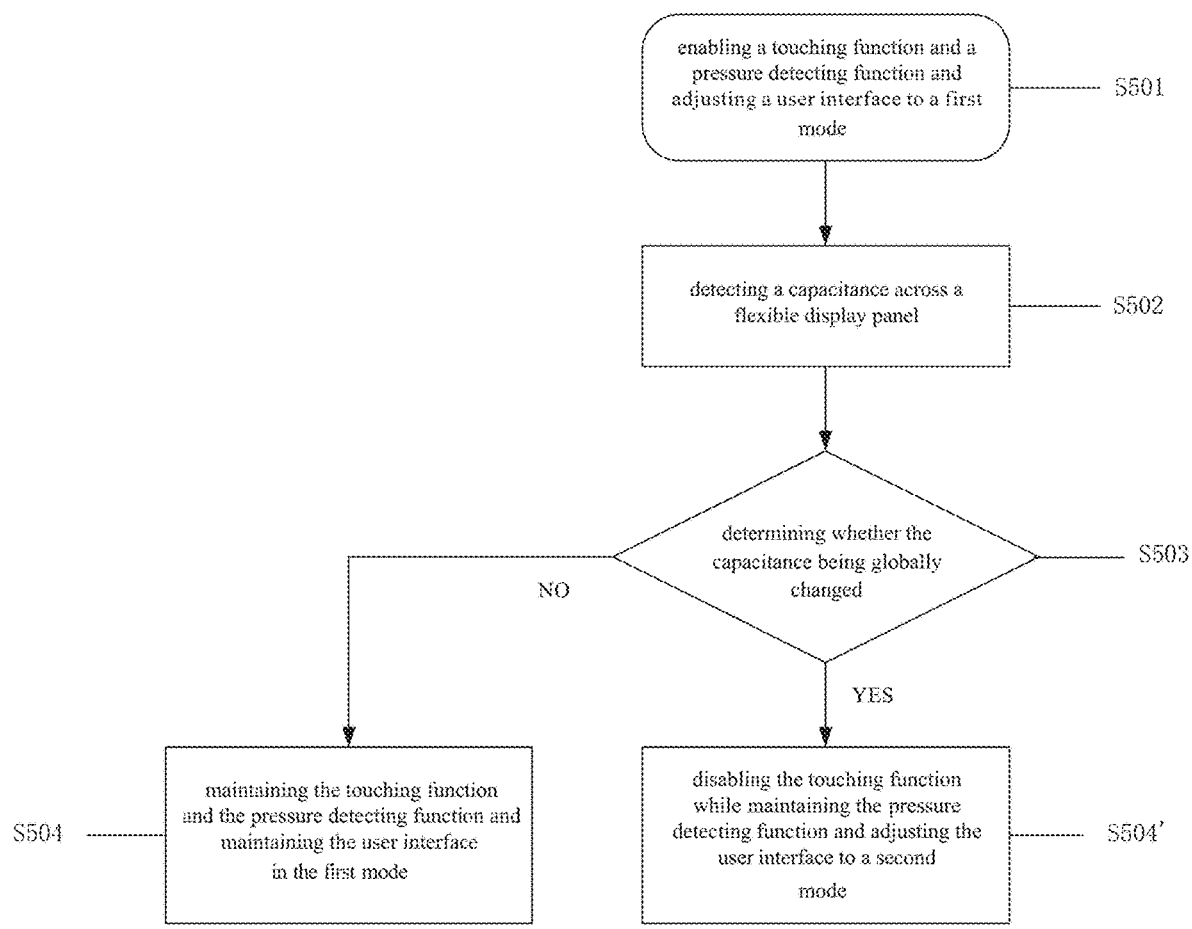
FIG. 5 illustrates a flow chart of a method of using a flexible display device in an underwater environment in accordance with an embodiment of the present disclosure.

FIG. 5 illustrates a flow chart of a method of using a flexible display device in an underwater environment in accordance with an embodiment of the present disclosure.

In step S501, a touching function of the touching device and a pressure detecting function of the pressure detecting device are enabled, and a user interface of the flexible display device is adjusted to a first mode. Here, the first mode refers to a 3D touching mode, that is, a normal touching mode in a dry environment.

In step S502, capacitance of the touching device across a touching region of the flexible display panel is detected. Specifically, the capacitance between the touching electrodes within all touching regions within the entire flexible display panel are detected.

In step S503, it is determined whether the capacitance are globally changed or locally changed across the flexible display panel. It should be noted that the globally changing implies that the capacitance within all touching regions are uniformly changed, and the locally changing implies that the capacitance within only a part of the touching region are changed and the capacitance of other touching regions aren't changed.

In step S504, in response to the capacitance being locally changed, the touching function and the pressure detecting function are maintained.

In step S504', in response to the capacitance being globally changed, the touching function is disabled while maintaining the pressure detecting function and adjusting the user interface of the flexible display device to a second mode different from the first mode. Here, the second mode refers to the underwater touching mode.

Figure 6:
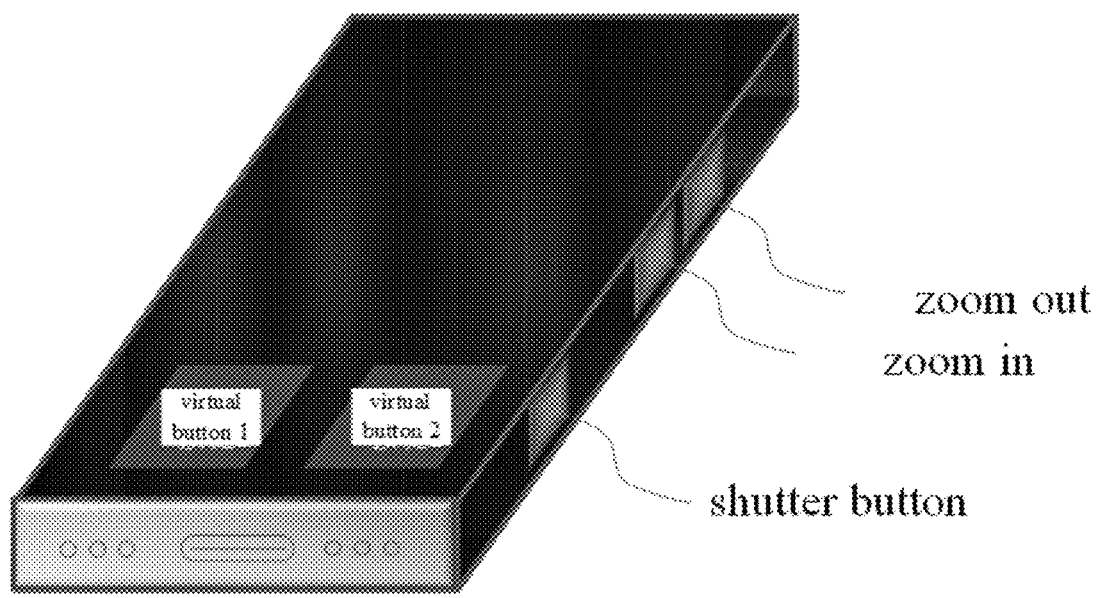
FIG. 6 illustrates a structural schematic view of a specific example of a flexible display device in accordance with an embodiment of the present disclosure.

As an example, in the case where the flexible display device is a mobile phone, after the mobile phone enters the underwater environment, the capacitive medium between the respective electrodes used for the touching and pressure detecting is converted from air to water. Here, the capacitance across the touching screen of the mobile phone is globally changed. At this time, the position input of the mobile phone control system is mainly based on pressure detecting, and the mobile phone control system can determine the approximate position being applied pressure by distinguishing the capacitance changes between different electrode blocks, thereby enabling the touching function underwater. It should be noted that, when the touching function is performed underwater, it is necessary to design a mobile phone interface design corresponding to the underwater environment. For example, a corresponding virtual touching button is designed at a position corresponding to the electrode of the pressure detecting device to implement a simple operation such as underwater shooting, turning on a flashlight, and the like. More specifically, as shown in FIG. 6, the underwater shooting virtual buttons may include a camera zoom button, a shutter button, and the like.

The foregoing description of the embodiments has been provided for purpose of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are included within the scope of the disclosure.

What is claimed is:

1. A flexible display device comprising a frame and a flexible display panel supported on the frame, the flexible display panel comprising:
   a flexible substrate and an organic light emitting device on the flexible substrate,
   wherein the flexible substrate comprises a first flexible layer, a second flexible layer, and a pressure sensitive layer and an electrode located between the first flexible layer and the second flexible layer,
   wherein the electrode comprises a plurality of sub-electrodes spaced apart in a direction parallel to the pressure sensitive layer,
   wherein the frame has a recess at a position corresponding to the sub-electrode,
   wherein the plurality of sub-electrodes is located on a side of the pressure sensitive layer facing away from the frame,
   wherein at least a surface of the recess of the frame comprises a conductive material,
   wherein the sub-electrode, the pressure sensitive layer, and the conductive material constitute a pressure detecting device,
   wherein the flexible substrate comprises a central region and an edge region surrounding the central region,
   wherein a size of the sub-electrode in the edge region is smaller than a size of the sub-electrode in the central region,
   wherein the frame is configured such that the edge region of the flexible substrate is curved,
   wherein the frame is configured such that the edge region is perpendicular to the central region, and
   wherein the frame has recesses at positions corresponding to the central region and the edge region.

2. The flexible display device according to claim 1, wherein the pressure sensitive layer comprises an elastic layer, and
   wherein the elastic layer comprises a polyimide foam material.

3. The flexible display device according to claim 1, wherein a material of the first flexible layer and a material of the second flexible layer are polyimide.

4. A method of using the flexible display device according to claim 1 in an underwater environment, wherein the flexible display device comprises a touching device and a pressure detecting device at least comprising the pressure sensitive layer and the electrode, the method comprising:

enabling a touching function of the touching device and a pressure detecting function of the pressure detecting device, and adjusting a user interface of the flexible display device to a first mode;

detecting a capacitance of the touching device across a touching region of the flexible display panel;

determining whether the capacitance being globally changed or locally changed across the flexible display panel;

in response to the capacitance being locally changed, maintaining the touching function and the pressure detecting function; and in response to the capacitance being globally changed, disabling the touching function while maintaining the pressure detecting function and adjusting the user interface of the flexible display device to a second mode different from the first mode.

5. The method according to claim 4, wherein the first mode is a 3D touching mode and the second mode is an underwater touching mode.

\* \* \* \* \*